US007149997B1

(12) United States Patent
Young et al.

(10) Patent No.: US 7,149,997 B1
(45) Date of Patent: Dec. 12, 2006

(54) ROUTING WITH FRAME AWARENESS TO MINIMIZE DEVICE PROGRAMMING TIME AND TEST COST

(75) Inventors: Jay T. Young, Louisville, CO (US); Jeffrey V. Lindholm, Longmont, CO (US); Ian L. McEwen, Golden, CO (US)

(73) Assignee: Xilinx, Inc., San Jose, CA (US)

( * ) Notice: Subject to any disclaimer, the term of this patent is extended or adjusted under 35 U.S.C. 154(b) by 292 days.

(21) Appl. No.: 10/966,643

(22) Filed: Oct. 15, 2004

(51) Int. Cl.
*G06F 17/50* (2006.01)
*G06F 1/24* (2006.01)
*G06F 9/45* (2006.01)

(52) U.S. Cl. .......................... 716/16; 716/18; 713/100
(58) Field of Classification Search .................. 716/16, 716/18; 713/100
See application file for complete search history.

(56) References Cited

U.S. PATENT DOCUMENTS

| 5,426,379 | A  | * | 6/1995  | Trimberger ................. 326/39  |
| 6,028,445 | A  | * | 2/2000  | Lawman ..................... 326/38  |
| 6,493,862 | B1 | * | 12/2002 | Young et al. ................ 716/16 |
| 6,496,971 | B1 | * | 12/2002 | Lesea et al. ................. 716/16 |
| 6,526,557 | B1 | * | 2/2003  | Young et al. ................ 716/16 |
| 6,594,610 | B1 | * | 7/2003  | Toutounchi et al. ........ 702/117   |
| 2002/0159446 | A1 | * | 10/2002 | Foster et al. .............. 370/357 |
| 2003/0189927 | A1 | * | 10/2003 | Foster et al. .............. 370/389 |
| 2003/0210685 | A1 | * | 11/2003 | Foster et al. .............. 370/389 |
| 2004/0088538 | A1 | * | 5/2004  | Isip et al. .................. 713/153 |
| 2005/0246520 | A1 | * | 11/2005 | Vadi et al. .................. 713/100 |
| 2006/0206850 | A1 | * | 9/2006  | McCubbrey ................. 716/17   |

OTHER PUBLICATIONS

Michael J. Alexander et al.; "An Architecture-Independent Approach to FPGA Routing Based on Multi-Weighted Graphs"; Association for Computing Machinery; Copyright 1994; ACM 0-89791-687-5/94/0009 3.50; pp. 1-6.

* cited by examiner

*Primary Examiner*—Phallaka Kik
(74) *Attorney, Agent, or Firm*—E. Eric Hoffman

(57) ABSTRACT

A method of routing a design on a programmable logic device (PLD) includes generating a database that identifies the correspondence between routing resources of the PLD and programming frames of the PLD. A first set of programming frames required to implement the logic of the design is identified, and the cost associated with using the first set of programming frames is eliminated. A second set of programming frames that are not used to implement the logic of the design is also identified, and the cost associated with using the second set of programming frames is maximized. Interconnect networks of the design are then routed, taking into account the costing of the programming frames. When a programming frame from the second set is used, the cost associated with using this programming frame is eliminated. This method minimizes used programming frames and maximizes unused programming frames, thus reducing PLD configuration time.

16 Claims, 5 Drawing Sheets

ROUTING WITH FRAME AWARENESS TO MINIMIZE DEVICE PROGRAMMING TIME AND TEST COST

FIELD OF THE INVENTION

The present invention relates to an improved scheme for configuring a programmable logic device. More specifically, the present invention relates to a method for minimizing the size of a configuration bit stream necessary to configure a programmable logic device.

RELATED ART

FIG. 1 is a block diagram of a conventional programmable logic system 100 in accordance with one embodiment of the present invention. Programmable logic system 100 includes programmable logic device 101 and test design router 150. In the described embodiment, programmable logic device 101 is a field programmable gate array (FPGA), which includes configuration logic 102, a plurality input/output blocks (IOBs) 111 located around the periphery of the device, an array of configurable logic blocks (CLBS) 121 arranged in rows and columns, and a plurality of block RAM (BRAM) elements 131 that extend along the column direction of CLB array 121. Configuration logic 102 includes a frame data register (FDR) 105. Clock resources and a programmable routing structure (not shown) are also located on programmable logic device 101. An associated configuration memory array (not shown) is loaded with configuration data values, which configure the above-described elements of programmable logic device 101. The configuration data values are loaded into the configuration memory array via configuration logic 101 in the manner described below. The above-described elements of programmable logic device 101 can be found in a conventional Virtex™-II FPGA, which is available from Xilinx, Inc., 2100 Logic Drive, San Jose, Calif. 95124.

FIG. 2 is a block diagram of frame data register 105 and a section 200 of programmable logic device 101, which includes a column of CLBs $201_1$–$201_N$, a top IOB 210, a bottom IOB 211, and the configuration memory array section 220 associated with CLBs $201_1$–$201_N$ and IOBs 210–211. Section 200 is illustrated in dashed lines in FIG. 1. Configuration memory array section 220 includes a plurality of configuration memory array subsections $220_0$–$220_{N+1}$. In the described embodiment, which is based on the Xilinx Virtex™-II FPGA described in Xilinx Application Note XAPP151, each configuration memory array subsection includes 18 rows and 48 columns of configuration memory cells, wherein each configuration memory cell stores a corresponding configuration bit. Each configuration memory cell controls an associated programmable interconnection point (PIP) in the associated CLB or IOB. Each of the configuration memory array subsections $220_0$–$220_{N+1}$ configures an associated IOB or CLB as illustrated. Note that in other embodiments, other dimensions are possible for the configuration memory array subsections $220_0$–$220_{N+1}$.

In the illustrated example, the configuration memory array is loaded on a column-by-column basis. An entire column of configuration data bits (hereinafter referred to as a programming frame) includes 18×(N+2) bits. One programming frame of configuration data bits is illustrated by shaded column 250 in FIG. 2. Each programming frame of configuration data bits includes (N+2) sub-frames, each having a width of 18-bits. During configuration, configuration data bits are serially shifted from test design router 150 into frame data register 105, until frame data register 105 stores a full programming frame of configuration data bits. The programming frame of configuration data bits is then simultaneously shifted out of frame data register 105 into an addressed column of the configuration memory array (e.g., into column 250 of configuration memory array section 220). This process is repeated until the entire configuration memory array is loaded with the desired configuration memory bits.

A typical configuration bitstream can include 1 million or more configuration data bits. As a result, a large external memory is required to store the configuration bitstream. In addition, it takes a relatively long time to load such a large bitstream. For example, it may take about 10 milliseconds to load a configuration bitstream having 1 million configuration data bits.

In order to test programmable logic device 101 after fabrication, the programmable logic device 101 is configured to implement a plurality of different designs. Each of the programmed designs is tested to ensure that the programmable logic device operates properly. The designs and tests are selected to ensure that all available resources (logic and routing) of the programmable logic device are functional. The cost of testing the programmable logic device is based on the amount of time required to successfully run all of the test designs. A significant portion of the total test time is associated with configuring the programmable logic device. Consequently, it is desirable to reduce the time required to configure the programmable logic device.

Programmable logic device 101 is typically reset prior to being configured. This reset operation causes logic zero values to be stored in each of the configuration memory cells of the programmable logic device 101.

Alternately, logic zero values can be stored in each of the configuration memory cells by performing a multi-frame write (MFW) operation. In a multi-frame write operation, the desired programming frame data (e.g., all logic zero values) is loaded (once) into the frame data register 105. A relatively short (8–32 bits) bit stream command is used to copy the stored data from the frame data register 105 to a specific (addressed) programming frame in the programmable logic device. The multi-frame write operation can be performed for each programming frame of the programmable logic device, such that each configuration memory cell stores a logic zero value. The multi-frame write operation is extremely fast, such that the time required to write logic zero values to each programming frame may be faster than performing a traditional reset operation on the programmable logic device.

After the reset (or multi-frame write) operation has been completed, a set of configuration data values is loaded into the configuration memory array, thereby providing the desired configuration.

Programmable logic device 101 may support a reduced configuration bit stream size, wherein a programming frame containing all logic zero configuration bits is not written to programmable logic device 101. A programming frame will typically have all logic zero configuration bits if the resources associated with the programming frame are not used in a particular design. A programming frame containing all logic zero configuration bits does not need to be written to the configuration memory array, because the configuration memory array was initially reset to store all logic zero bits. This option is referred to as a "Don't Write Zero Frames" (DWZF) option.

General-purpose routers, such as test design router 150, have typically been used to route test designs on the programmable logic device 101. These routers use a minimal set of routing resources on the FPGA to route the desired interconnection network. The configuration bit streams generated by the routers often include many programming frames that include all logic zero values, due to minimal resource usage on the FPGA. However, these logic zero programming frame values are the result of chance, because the router has no information identifying the resources associated with each programming frame of the configuration bit stream.

It would therefore be desirable to have a scheme for controlling the routing of a design to maximize the number of programming frames having all logic zero values, thereby minimizing the required configuration bit stream size and the programming time of the associated programmable logic device. It would also be desirable to reduce the cost associated with testing a programmable logic device.

SUMMARY

Accordingly, the present invention provides a method of routing a design on a programmable logic device that includes generating a database that identifies the correspondence between routing resources of the programmable logic device and programming frames of the programmable logic device. More specifically, the database identifies which programming frame (or frames) a particular routing resource will use.

The database identifies programming frames having any set bits (i.e., used programming frames) and programming frames having no set bits (i.e., unused programming frames). During routing expansion, routing resources that are in unused programming frames are costed more heavily than routing resources in used programming frames. This costing causes the routing to naturally migrate into clumps of more heavily used programming frames, and thereby leave more programming frames totally empty.

For example, a first set of programming frames that must be used to implement the logic of the design is identified, and the cost associated with using the first set of programming frames is eliminated. A second set of programming frames that are not used to implement the logic of the design is also identified, and the cost associated with using the second set of programming frames is maximized. Interconnect networks of the design are then routed, taking into account the costing of the programming frames. When a programming frame from the second set is used to route an interconnect network, the cost associated with using this programming frame is eliminated. By maximizing the cost of unused programming frames, the number of unused programming frames at the end of the routing process is advantageously maximized. As the number of unused programming frames is increased, the required configuration bit stream size can be reduced. In one embodiment, the unused programming frames do not have to be programmed, because all of the programming frames are initially programmed to store logic zero values. In an alternate embodiment, all of the unused programming frames are programmed to store logic zero values using an efficient multi-frame write operation.

In one embodiment, the present invention reduces bit stream size for test designs used in device verification. A smaller configuration bit stream requires less time to configure the programmable logic device and/or allows the use of less expensive test equipment, thereby leading to lower testing costs. Note that the programming time for a test design represents a large portion of the cost of testing the programmable logic device.

Test designs tend to have self-repeating patterns. Thus, the routing implemented on a small programmable logic device in accordance with the present invention can be used as a template for the routing implemented on a large programmable logic device in the same device family. Thus, the large programmable logic device benefits from the same unused programming frames as the small programmable logic device, which was used to create the routing template.

In another embodiment, the present invention can be used in connection with a user design, to reduce the configuration time and/or allow a smaller configuration ROM to be used. In general, the present invention can be used in any application where a smaller configuration bit stream is advantageous.

The present invention will be more fully understood in view of the following description and drawings.

DETAILED DESCRIPTION

Figure 1:
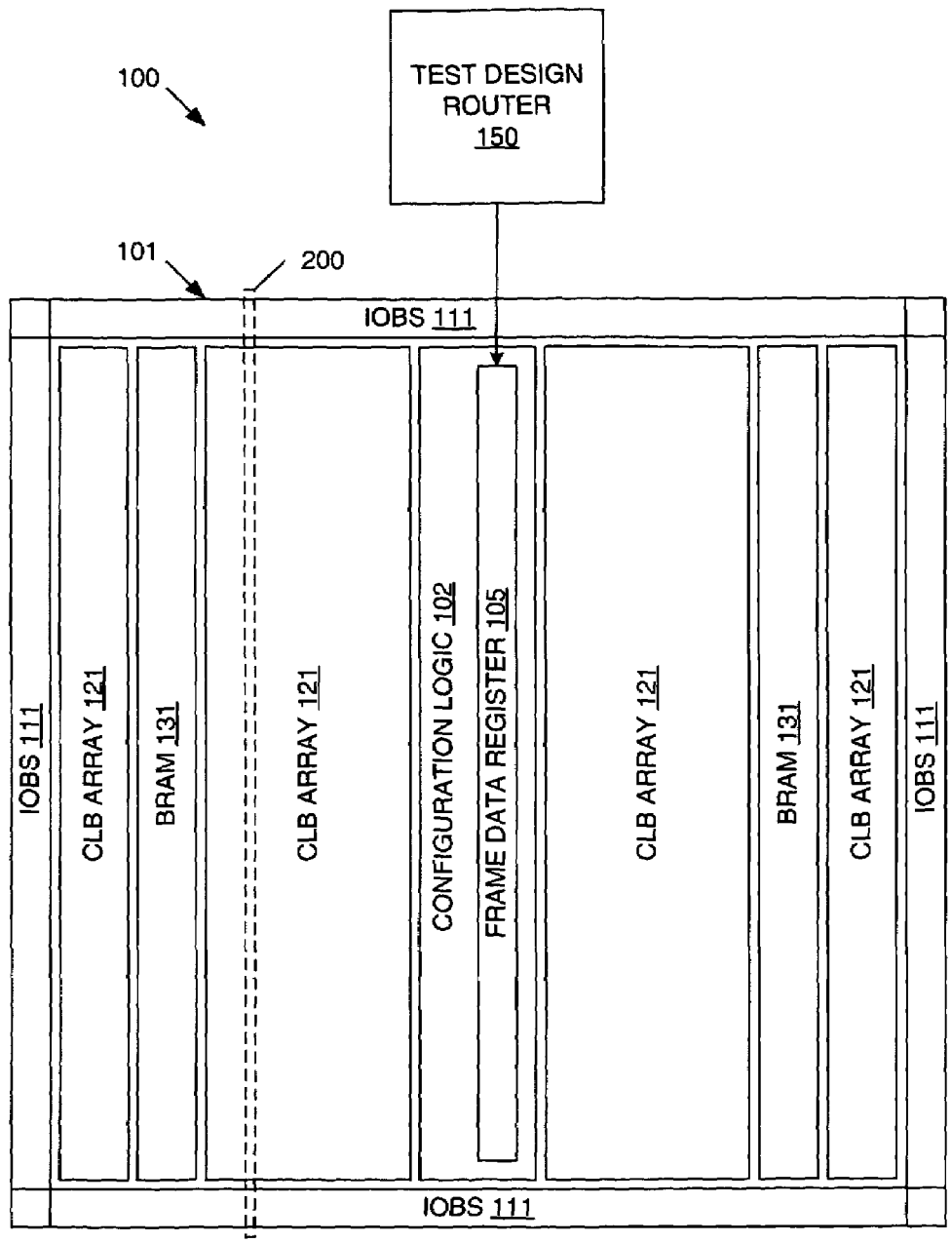
FIG. 1 is a block diagram of a conventional programmable logic system.
Figure 2:
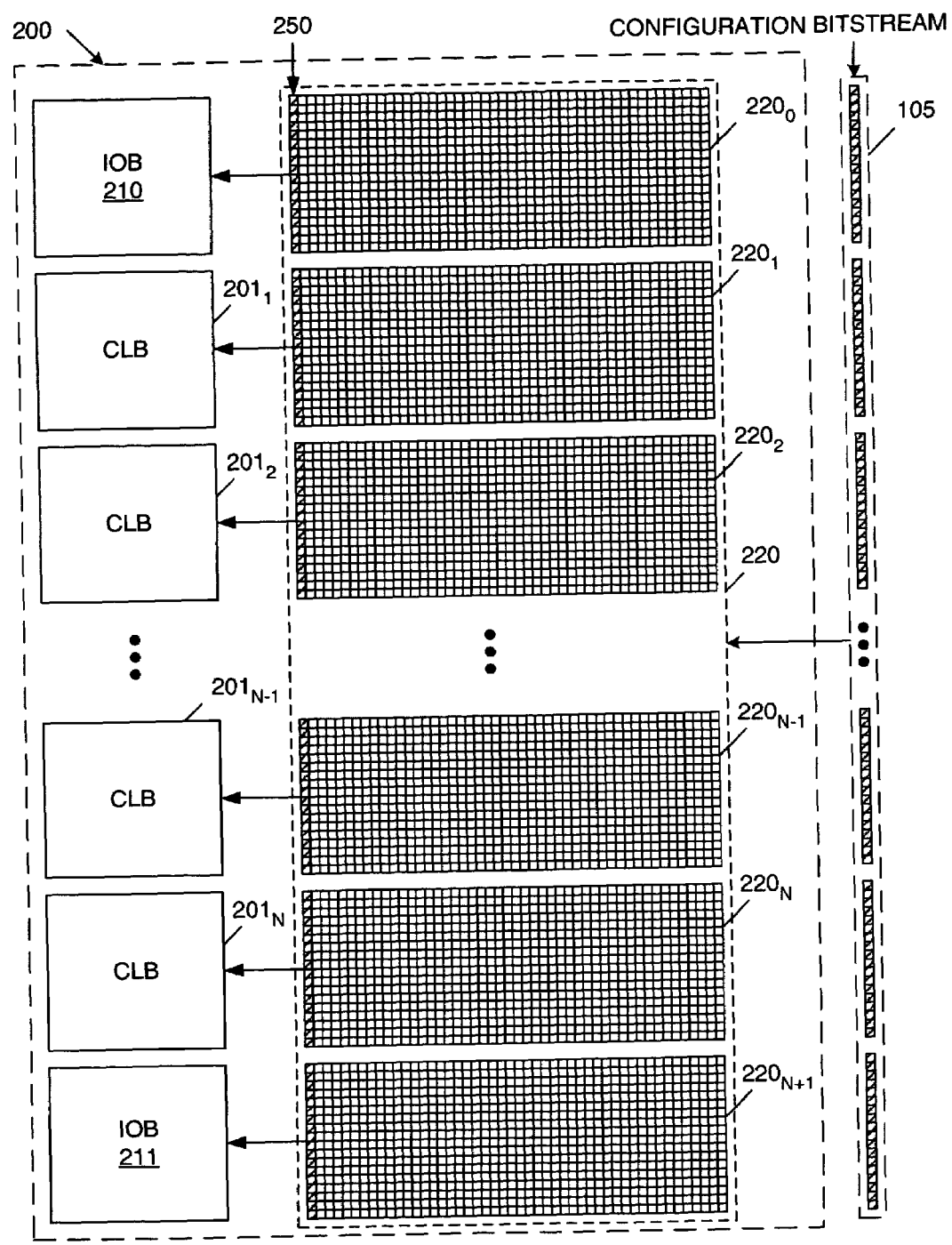
FIG. 2 is a block diagram of a frame data register and a section of a programmable logic device, which includes a column of CLBs, a top IOB, a bottom IOB, and the associated configuration memory array section.

The present invention provides a method for routing a design on a programmable logic device with "frame awareness", such that there are a maximum number of programming frames that are unused (i.e., contain all logic zero configuration data values). In a first embodiment, all programming frames are initially programmed to store logic zero values, using either a conventional reset operation or a multi-frame write operation. In this embodiment, the unused programming frames do not need to be programmed, because these programming frames initially contain logic zero values. Thus, a Don't Write Zero Frame option can be selected for each of the unused programming frames. As a result, the configuration bit stream size is reduced, thereby reducing programming time of the programmable logic device.

In a second embodiment, the programming frames are not initially programmed to store logic zero values. Instead, after the unused programming frames have been identified, these unused programming frames are programmed to store logic zero values using an efficient multi-frame write operation. Again, the configuration bit stream size is reduced, thereby reducing programming time of the programmable logic device.

In accordance with one embodiment, a wave front expansion router is used to implement the present invention. However, it is understood that any router may be used. A router supporting a "rip-up and reroute" feature or a "shoving" feature should be used for optimal results. Both of these features are well known, and are described in more detail by Michael J. Alexander, James P. Cohoon, Joseph L. Ganley and Gabriel Robins in "An Architecture-Independent Approach to FPGA Routing Based on Multi-Weighted Graphs", Association for Computer Machinery, ACM 0-89791-687-5/94/0009 (1994). Other routing methods may also be used, but the details of implementing the present invention may be different in these cases. The underlying router implementation details are not important to the present invention, so long as the router used has the ability to dynamically provide cost functions for routing resources and can reroute interconnect networks (nets) to reduce the overall resource cost. For example, the present invention may use a production router (which implements a place and route (PAR) program) to perform the routing. This PAR program need only be modified to provide an interface to cost routing resources based on the programming frames impacted by these resources.

In order to maximize the number of unused programming frames it is necessary to make it difficult for the router to use routing resources associated with unused programming frames. The method for accomplishing this can be generally defined as follows.

First, the routing resources of the programmable logic device are mapped to the programming frames, such that the mapping identifies which programming frames are affected by each routing resource. It is possible that some routing resources may affect multiple programming frames, depending on the model implementation.

Second, the resource costing function used by the router's cost based expansion is modified to highly cost the routing resources associated with unused programming frames.

Third, a "used" frame database is established to identify the programming frames that have been used by the router. The used frame database allows inquiry to determine whether a programming frame is currently used in the design. The resource costing function assigns a low cost (e.g., zero) to routing resources associated with used programming frames.

Fourth, routing resources associated with unused programming frames are allowed to be excluded from use during the routing operation.

Certain design specific changes may be implemented as follows. For some designs, specific routing resources must be used. Examples of such specific routing resources include routing resources directly attached to sources (drivers) of the interconnect network, and sinks (loads) that must be used to route the interconnect network. These specific routing resources and the associated programming frames are initially identified. The programming frames associated with these specific routing resources are marked as "used" in the used frame database, thereby removing the cost associated with using the routing resources associated with these programming frames. As a result, the router is provided more freedom in routing the interconnect networks and allows better initial choices of which programming frames to use, thereby leading to more unused programming frames at the end of the process.

Stated another way, an interconnect network will generally have many possible routing solutions. However, all the solutions will share certain common resources that are required for the network to be routed. That is, the set intersection of all possible routing solutions for an interconnect network will be non-null. These common routing resources are typically found at the source (driver) and sink (load) locations of the network. The programming frames containing these common resources are marked as "used" before any routing is done.

In some cases, it is possible to identify programming frames that must be used even without knowing that a specific routing resource must be used. For example, if a 3-to-1 multiplexer is used to drive a signal "A" on a load pin, then the three routing resources associated with the inputs of the multiplexer can only be used by signal "A", even though only one of the three routing resources is necessary to route the interconnect network. If all three of the routing resources associated with the 3-to-1 multiplexer exist in the same programming frame, then this programming frame may be considered as a programming frame that must be used, and may therefore be marked as "used" in the manner described above.

A base method, which can be used to route a design while maximizing the number of empty programming frames, is described in more detail below.

Figure 3:
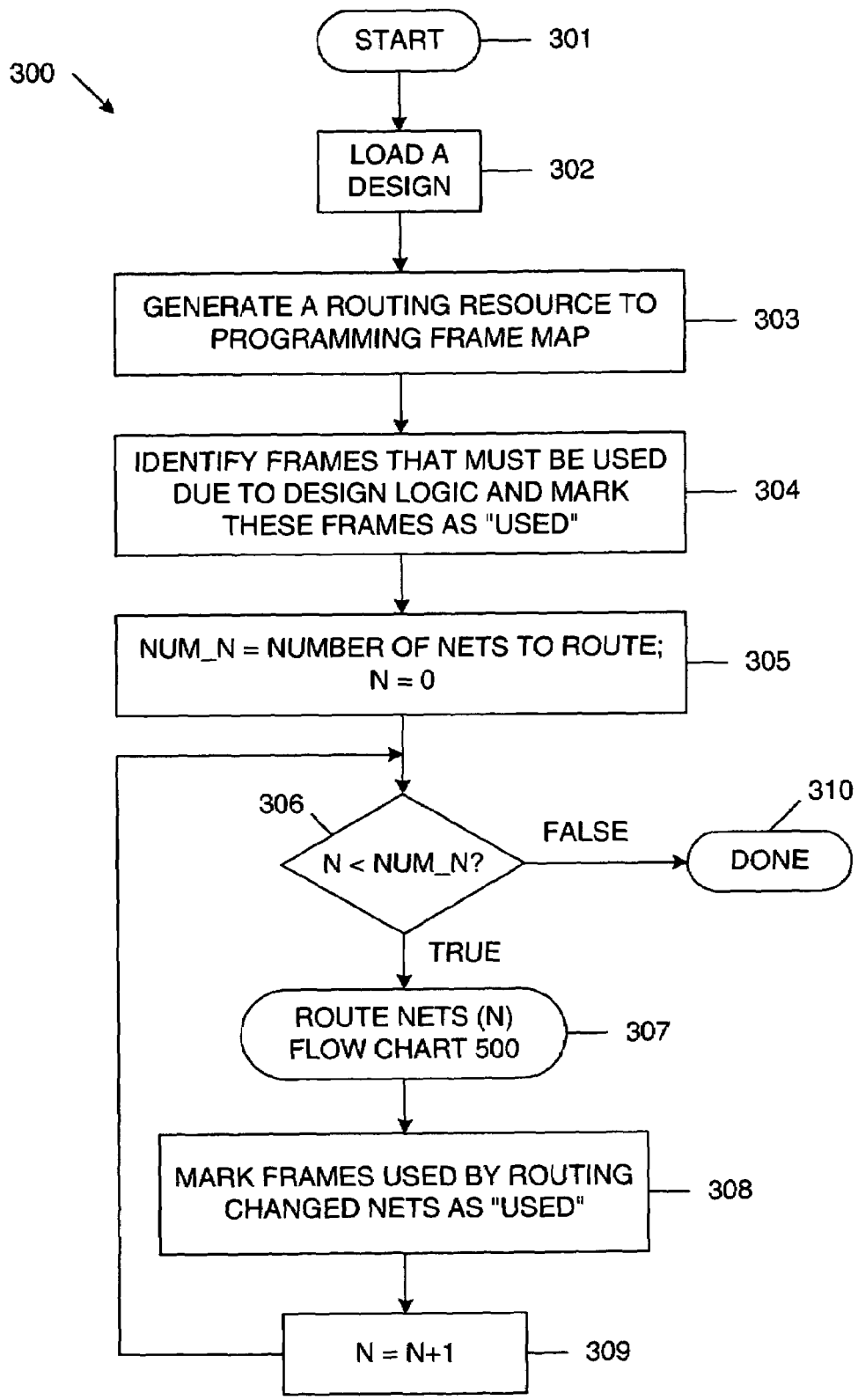
FIG. 3 is a flow diagram illustrating a base method of routing a design in accordance with one embodiment of the present invention.

FIG. 3 is a flow diagram illustrating a base method 300 of routing a design in accordance with one embodiment of the present invention.

After the method is started (Step 301), a design for the programmable logic device is loaded into a router, such as router 150 (Step 302). In response to the design, the router generates a map that identifies the correspondence between the routing resources of the programmable logic device and the associated programming frames that control the routing resources. (Step 303). A sufficiently fast function F is available to the router such that FrameId=F(r), where FrameId identifies a programming frame, and 'r' identifies a routing resource in the device model. For example, this map may indicate that the routing resources B–Z are controlled by the contents of programming frame A. Note that the router is considering routing resources and wants to know the programming frame with which the routing resources are associated. In the present embodiment, the router does not consider a programming frame and want to know what resources are associated with that frame. However, in other embodiments, modifications to the method can be imagined in which the database would work in both directions.

Figure 4:
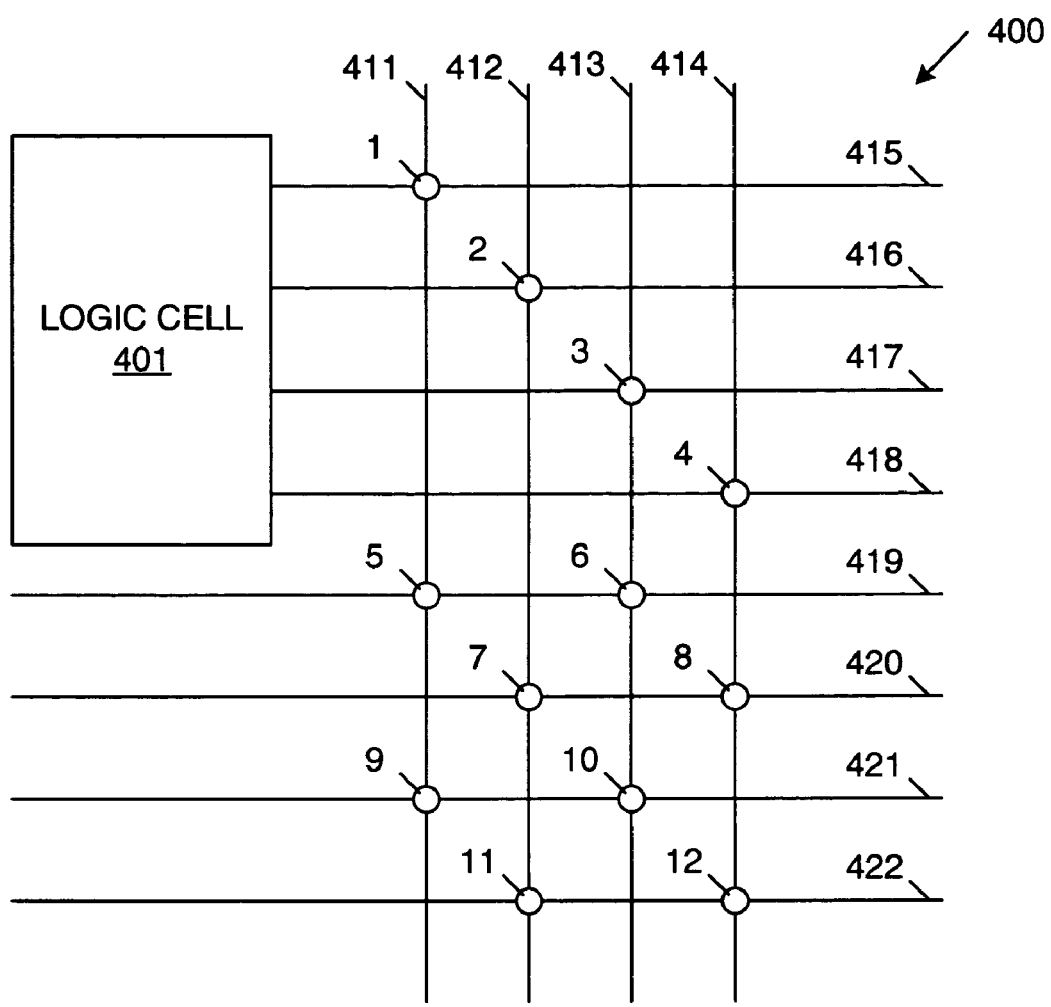
FIG. 4 is a block diagram that is used to illustrate the mapping of a set of routing resources to programming frames for a portion of a FPGA fabric in accordance with one embodiment of the present invention.

FIG. 4 is a block diagram of a portion of a representative FPGA fabric 400, including a logic cell 401, routing wires 411–422 and programmable routing resources (switches) 1–12. Routing resources 1–12 are controlled by configuration data bits in one of three programming frames, hereinafter identified as frames A, B and C. Note that there are many other routing resources and programming features (not shown), which are controlled by other bits in these programming frames. Table 1 below identifies which programming frame(s) contain the configuration bits that control the programming of each of the routing resources 1–12. Note that it is possible for one routing resource to be controlled by bits in multiple programming frames.

TABLE 1

Routing Resource to Programming Frame Association

| Routing Resource ID | Programming Frame (s) |
|---|---|
| 1 | A, C |
| 2 | A, C |
| 3 | B |
| 4 | B |
| 5 | C |
| 6 | B |

TABLE 1-continued

Routing Resource to Programming Frame Association

| Routing Resource ID | Programming Frame (s) |
|---|---|
| 7 | C |
| 8 | B |
| 9 | C |
| 10 | B |
| 11 | C |
| 12 | B |

The router then identifies all of the programming frames that must be used due to the specific logic of the design. The router then marks the programming frames used in the creation of this logic as "used" frames. (Step 304). The router also removes any cost associated with the use of these already "used" programming frames.

The number of interconnect networks (i.e., nets) to be routed in the design is specified as the value NUM_N (Step 305). A current net value N, which identifies the current interconnect network being routed, is initially set to zero (Step 305). If the current net value N is less than the number of interconnect networks NUM_N in the design (Step 306, True branch), then the current interconnect network (identified by current net value N) is routed in the manner described below in connection with flow chart 500 (Step 307). After the current interconnect network has been routed, the router marks the programming frames used in the routing of the interconnect network as "used" programming frames, and removes any cost associated with the further use of these programming frames (Step 308). The current net value N is then incremented (Step 309), and processing continues with Step 306. If the current net value N is not less than the total number of interconnect networks NUM_N in the design (Step 306, false branch), then the process is complete (Step 310).

Figure 5:
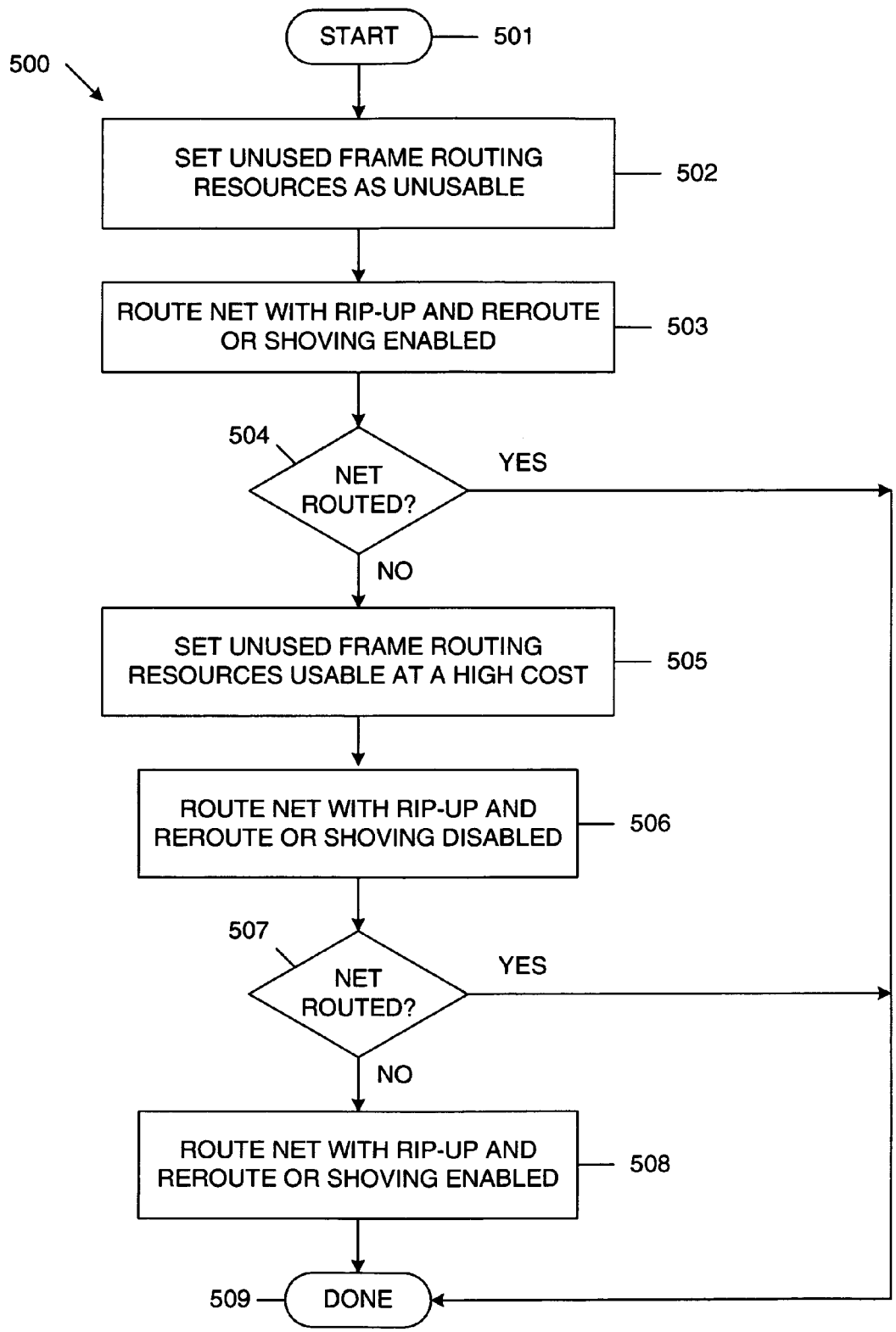
FIG. 5 is a flow chart illustrating the routing of a current interconnect network, in accordance with one embodiment of the present invention.

FIG. 5 is a flow chart 500 illustrating the details of the routing of the current interconnect network, in accordance with one embodiment of the present invention.

After the method of flow chart 500 is started (Step 501), the router designates the routing resources associated with the unused programming frames as "unusable" (Step 502). Thus, initially, the only routing resources available for routing an interconnect network are those routing resources that correspond with the initially "used" programming frames (See, Step 304).

The current interconnect network is then routed with the rip-up and reroute or shoving feature of the router enabled (Step 503). If the router is able to successfully route the current interconnect network without using the routing resources associated with the "unusable" programming frames (Step 504, Yes branch), then the routing of the current interconnect network is complete (Step 509) and processing returns to Step 308 (FIG. 3).

However, if the current interconnect network cannot be successfully routed without using the routing resources associated with the "unusable" programming frames (Step 504, No branch), then the routing resources associated with the "unusable" programming frames are set as "usable", but with a high cost (Step 505). As a result, the previously "unusable" programming frame routing resources may now be used if necessary. The router then attempts to route the current interconnect network with the rip-up and reroute or shoving feature of the router disabled (Step 506). If the current interconnect network is successfully routed at this point (Step 507, Yes branch), then the current interconnect network is complete (Step 509) and processing returns to Step 308 (FIG. 3).

However, if the current interconnect network cannot be successfully routed with the rip-up and reroute or shoving feature of the router disabled (Step 507, No branch), then the current interconnect network is routed with the rip-up and reroute or shoving feature of the router enabled (Step 508), thereby ensuring that the current interconnect network is successfully routed. All programming frames associated with the routing resources used by the current interconnect network are then marked as "used" programming frames. In addition, any programming frames associated with the routing resources used by other interconnect networks that may have been re-routed due to shoving or rip-up and reroute are also marked as "used" programming frames. The router sets the cost of further using these "used" programming frames to zero. After the current interconnect network is successfully routed (Step 509), processing returns to step 308 (FIG. 3).

In accordance with the present embodiment, the programming frames of the programmable logic device are initially programmed to store all logic zero values, using either a conventional reset operation or a multi-frame write operation. In this embodiment, only the "used" programming frames need to be written to the configuration memory cells of the programmable logic device. Unused programming frames are not written, using a Don't Write Zero Frames option. The above-described method will reduce configuration bit stream size and programming time, thereby reducing device test cost.

The enhancements described below can further reduce routing run time and/or configuration bit stream size.

In one variation, steps 502–504 are eliminated, thereby eliminating the first routing pass associated with the current interconnect network. This advantageously reduces the time required to route the design.

In another variation, the complete design is quickly routed using a generic router, thereby identifying the programming frames that are highly used. These highly used programming frames are set as "used" programming frames, thereby removing the cost associated with using the associated resources. All of the interconnect networks are then un-routed, and then routed using the method of FIGS. 3 and 5, while maintaining the "used" designations. This optimization results in a reduced run time and typically generates more unused programming frames due to lack of routing congestion, which may be caused by the method of FIGS. 3 and 5. The reduced run time results from the fact that rip-up and reroute or shoving techniques are not used as often.

In another variation, an additional clean up pass is performed after all of the interconnect networks have been routed, thereby freeing up currently used programming frames. This pass advantageously allows resources associated with programming frames added later in the process to be used in place of resources associated with programming frames used early in the process, thereby freeing up some of the programming frames chosen for use earlier in the process.

In another variation, the cost of the initial use of a programming frame is selected in view of the versatility of the routing resources associated with the programming frame. More specifically, programming frames associated with more versatile routing resources are assigned a lower cost, thereby promoting the use of these routing resources. As a result, programming frames associated with more versatile routing resources are more likely to be used, thereby reducing the overall programming frame usage. Note that in this variation, all programming frames are not equal. Some programming frames contain resources that are more versatile in routing even though it may take more routing resources to route the interconnect networks. For example, it may be optimal to use programming frames associated with double length routing resources than programming frames associated with hex length routing resources because of the routing capabilities of the double length routing resources. Note that this variation is very specific to the routing of the device being configured.

In another variation, the user may know that certain programming frames should never be used. If programming frame usage is disallowed for these programming frames, then a run time optimization is possible since the routing algorithm will not need to visit this routing at all. It is design specific as to whether fewer programming frames are used.

In another embodiment, the programming frames of the programmable logic device are not initially programmed to store all logic zero values. Instead, a multi-frame write operation is used to write logic zero data values to each of the "unused" programming frames. In this case, the size of the configuration bit stream is increased slightly with respect to the above-described Don't Write Zero Frames option. However, the required programming time is reduced when implementing the multi-frame write operation. The multi-frame write operation and Don't Write Zero Frames operation are only examples of how to minimize the configuration data stream. Other similar operations would be apparent to one of ordinary skill in the art. By generating a design with more empty programming frames, the logic device configuration time can be made faster.

Although the invention has been described in connection with several embodiments, it is understood that this invention is not limited to the embodiments disclosed, but is capable of various modifications, which would be apparent to one of ordinary skill in the art. For example, although the present invention has described a programming frame as including a full column of configuration data bits, it is understood that a programming frame can be defined to include less than a full column of configuration data bits. For example, a programming frame may include one or more sub-frames of configuration data bits. Thus, the present invention is only intended to be limited by the following claims.

We claim:

1. A method of routing a design on a programmable logic device comprising:
   generating a database that identifies a correspondence between routing resources of the programmable logic device and programming frames of the programmable logic device that control the routing resources;
   identifying in the database a first set of programming frames that must be used to implement logic of the design, and eliminating a cost associated with using the first set of programming frames;
   identifying in the database a second set of programming frames that are not used to implement logic of the design, and maximizing a cost associated with using the second set of programming frames; and then
   routing, based on the identified first and second sets an interconnect network associated with the logic of the design.

2. The method of claim 1, wherein the step of routing the interconnect network comprises:
   attempting to route a first interconnect network using only the first set of programming frames.

3. The method of claim 2, wherein a rip-up and reroute or shoving function is enabled while attempting to route the first interconnect network.

4. The method of claim 1, wherein the step of routing the interconnect network comprises:
   attempting to route a first interconnect network using the first and second sets of programming frames, wherein the costs associated with the first and second sets of programming frames are used in the routing process.

5. The method of claim 4, further comprising disabling a rip-up and reroute or shoving function during the step of attempting to route the first interconnect network.

6. The method of claim 5, wherein if the first interconnect network cannot be routed with the rip-up and reroute or shoving function disabled, then further comprising attempting to route the first interconnect network using the first and second sets of programming frames, wherein the costs associated with the first and second sets of programming frames are considered in the routing process, wherein a rip-up and reroute or shoving function is enabled.

7. The method of claim 4, wherein the first interconnect network is routed using a subset of the programming frames of the second set, the method further comprising eliminating a cost associated with using the subset of the programming frames of the second set.

8. The method of claim 1, wherein the step of routing the interconnect network comprises:
   routing a first interconnect network using the first and second sets of programming frames, wherein the costs associated with the first and second sets of programming frames are used in the routing process;
   eliminating the cost associated with using any programming frame of the second set that is used to route the first interconnect network; and then
   routing a second interconnect network using the first and second sets of programming frames, wherein the costs associated with the first and second sets of programming frames are used in the routing process.

9. A router for routing a design on a programmable logic device comprising:
   means for generating a database that identifies a correspondence between routing resources of the programmable logic device and programming frames of the programmable logic device that control the routing resources;
   means for identifying in the database a first set of programming frames that must be used to implement logic of the design, and eliminating a cost associated with using the first set of programming frames;
   means for identifying in the database a second set of programming frames that are not used to implement logic of the design, and maximizing a cost associated with using the second set of programming frames; and
   means for routing, based on the identified first and second sets an interconnect network associated with the logic of the design.

10. The router of claim 9, wherein the means for routing the interconnect network comprises:
    means for attempting to route a first interconnect network using only the first set of programming frames.

11. The router of claim 10, further comprising means for enabling a rip-up and reroute or shoving function while attempting to route the first interconnect network.

12. The router of claim 9, wherein the means for routing the interconnect network comprises:
    means for attempting to route a first interconnect network using the first and second sets of programming frames, wherein the costs associated with the first and second sets of programming frames are used in the routing process.

13. The router of claim 12, further comprising means for disabling a rip-up and reroute or shoving function during executing the means for attempting to route the first interconnect network.

14. The router of claim 13, further comprising means for enabling a rip-up and reroute or shoving function during executing the means for attempting to route the first interconnect network.

15. The router of claim 12, further comprising means for eliminating a cost associated with any programming frame used to implement the first interconnect network.

16. The router of claim 9, wherein the means for routing the interconnect network comprises:

means for routing a first interconnect network using the first and second sets of programming frames, wherein the costs associated with the first and second sets of programming frames are used in the routing process;

means for eliminating the cost associated with using any programming frame of the second set that is used to route the first interconnect network; and means for routing a second interconnect network using the first and second sets of programming frames, wherein the costs associated with the first and second sets of programming frames are used in the routing process.

* * * * *